United States Patent
Gelorme et al.

(10) Patent No.: US 12,027,442 B1
(45) Date of Patent: Jul. 2, 2024

(54) THERMAL INTERFACE MATERIAL, AN INTEGRATED CIRCUIT FORMED THEREWITH, AND A METHOD OF APPLICATION THEREOF

(71) Applicant: Arieca Inc., Pittsburgh, PA (US)

(72) Inventors: Jeffrey Gelorme, Burlington, CT (US);
Navid Kazem, Pittsburgh, PA (US);
Keyton D. Feller, Pittsburgh, PA (US);
Hing Jii Mea, Pittsburgh, PA (US);
Dylan S. Shah, Pittsburgh, PA (US);
Allyssa Kerr, Pittsburgh, PA (US);
Vivek Singh, Pittsburgh, PA (US)

(73) Assignee: ARIECA INC., Pittsburgh, PA (US)

( * ) Notice: Subject to any disclaimer, the term of this patent is extended or adjusted under 35 U.S.C. 154(b) by 0 days.

(21) Appl. No.: 18/526,591

(22) Filed: Dec. 1, 2023

Related U.S. Application Data

(60) Provisional application No. 63/482,449, filed on Jan. 31, 2023.

(51) Int. Cl.
*H01L 23/373* (2006.01)
*C08K 3/08* (2006.01)
*C08L 71/02* (2006.01)
*C09K 5/06* (2006.01)
*H01L 23/00* (2006.01)

(52) U.S. Cl.
CPC ............ *H01L 23/3733* (2013.01); *C08K 3/08* (2013.01); *C08L 71/02* (2013.01); *C09K 5/063* (2013.01); *H01L 24/29* (2013.01); *H01L 24/32* (2013.01); *H01L 24/83* (2013.01); *C08K 2201/001* (2013.01); *C08L 2203/20* (2013.01); *C08L 2312/00* (2013.01); *H01L 2224/2929* (2013.01); *H01L 2224/29301* (2013.01); *H01L 2224/29305* (2013.01); *H01L 2224/29309* (2013.01); *H01L 2224/29311* (2013.01); *H01L 2224/32221* (2013.01); *H01L 2224/83201* (2013.01); *H01L 2224/83862* (2013.01); *H01L 2924/0108* (2013.01); *H01L 2924/0133* (2013.01); *H01L 2924/061* (2013.01); *H01L 2924/0635* (2013.01); *H01L 2924/0665* (2013.01); *H01L 2924/095* (2013.01)

(58) Field of Classification Search
CPC ..... H01L 23/3723; H01L 24/29; H01L 24/32; H01L 24/83; H01L 2224/2929; H01L 2224/29301; H01L 2224/29305; H01L 2224/29309; H01L 2224/29311; H01L 2224/32221; H01L 2224/83201; H01L 2224/83862; H01L 2924/0108; H01L 2924/0133; H01L 2924/061; H01L 2924/0635; H01L 2924/0665; H01L 2924/095; C08K 3/08; C08K 2201/001; C08L 71/02; C08L 2203/20; C08L 2312/00; C09K 5/063
USPC ........................................................ 428/414
See application file for complete search history.

(56) References Cited

U.S. PATENT DOCUMENTS

| | | | |
|---|---|---|---|
| 5,445,308 A | | 8/1995 | Nelson et al. |
| 10,777,483 B1 * | | 9/2020 | Kazem ................. C09K 5/12 |
| 11,021,607 B2 | | 6/2021 | Bhagwagar et al. |
| 2005/0228097 A1 | | 10/2005 | Zhong |
| 2007/0131055 A1 | | 6/2007 | Cheng et al. |
| 2008/0023665 A1 | | 1/2008 | Weiser et al. |
| 2008/0291634 A1 | | 11/2008 | Weiser et al. |
| 2011/0038124 A1 | | 2/2011 | Burnham et al. |
| 2021/0125896 A1 | | 4/2021 | Arrington et al. |
| 2023/0034217 A1 | | 2/2023 | Mayukh et al. |

FOREIGN PATENT DOCUMENTS

| | | | |
|---|---|---|---|
| CN | 1872942 A | * | 12/2006 |
| CN | 1923944 B | | 6/2012 |
| CN | 104031600 B | | 3/2016 |
| CN | 103665770 B | | 7/2016 |
| CN | 107393627 B | | 11/2019 |
| EP | 0696630 A2 | | 2/1996 |
| EP | 0696630 A3 | | 5/1997 |
| KR | 20190016856 A | | 2/2019 |
| KR | 102176691 B1 | | 11/2020 |
| WO | 2019/136252 A1 | | 7/2019 |
| WO | 20220204689 A1 | | 9/2022 |
| WO | 2023081478 A1 | | 5/2023 |

OTHER PUBLICATIONS

Translation of CN 1872942, Dec. 6, 2006. (Year: 2006).*

* cited by examiner

*Primary Examiner* — Hui H Chin
(74) *Attorney, Agent, or Firm* — K&L Gates LLP

(57) ABSTRACT

A thermal interface material, an integrated circuit formed therewith, and a method of application thereof are provided. The thermal interface material includes 5% to 30% by volume of a polymer component and at least 70% by volume of liquid metal droplets, all based on total volume of the thermal interface material. The polymer component has a first polymer having a molecular weight in a range of 400 g/mol to 400,000 g/mol. The liquid metal droplets are dispersed throughout the polymer component.

30 Claims, 1 Drawing Sheet

THERMAL INTERFACE MATERIAL, AN INTEGRATED CIRCUIT FORMED THEREWITH, AND A METHOD OF APPLICATION THEREOF

CROSS-REFERENCE TO RELATED APPLICATIONS

This application claims priority to U.S. Provisional Patent Application No. 63/482,449, which was filed on Jan. 31, 2023, the contents of which is hereby incorporated by reference into this specification.

FIELD

The present disclosure relates to a thermal interface material, an integrated circuit formed therewith, and a method of application thereof.

BACKGROUND

A thermal interface material (TIM) can be used to thermally connect two or more layers together. For example, TIMs are often used in CPU packages to thermally connect the integrated heat spreader (IHS) of a CPU package to a heat sink. There are various types of TIMs that may be used. However, certain TIMs used present challenges.

SUMMARY

In one general aspect, the present disclosure is directed towards a thermal interface material comprising 5% to 30% by volume of a polymer component and at least 70% by volume of liquid metal droplets, all based on total volume of the thermal interface material. The polymer component has a first polymer having a molecular weight in a range of 400 g/mol to 400,000 g/mol. The liquid metal droplets are dispersed throughout the polymer component.

In another general aspect, the present disclosure is directed towards a thermal interface material comprising 5% to 30% by volume of a polymer component and at least 70% by volume of liquid metal droplets, all based on a total volume of the thermal interface material. The polymer component can comprise polyalkylene glycol having a molecular weight in a range of 400 g/mol to 4,000 g/mol. The liquid metal droplets are dispersed throughout the polymer component. In various examples, the polyalkylene glycol comprises at least one of polyethylene glycol, polypropylene glycol, polybutylene glycol, and a co-polymer thereof, such as, for example, polypropylene glycol. In certain examples, the polymer component further comprises a second polymer, which can be miscible with the polyalkylene glycol. For example, the second polymer can comprise at least one of an epoxy polymer, an acrylate polymer, a vinyl polymer, and a silicon hydride polymer, such as, for example, an epoxy polymer comprising a hydroxyl terminal group. In certain examples, the polymer component is configured to extend a polymer chain of the second polymer responsive to heating to a temperature of at least 50° C.

The present invention can provide both a low contact resistance at the material interfaces and a low thermal resistance through the TIM. The low contact resistance can be enabled by the application of the polymer in a conformable state so that the polymer and liquid metal droplets can adapt to the surface of the layer to achieve a desired contact resistance. The low thermal resistance through the TIM can be enabled by liquid metal droplets. The TIM can be removable such that the TIM can be used during testing of components and/or can enable replacement of components as desired. These and other benefits realizable from various embodiments of the present invention will be apparent from the description that follows.

BRIEF DESCRIPTION OF THE DRAWINGS

The features and advantages of various examples of the present invention, and the manner of attaining them, will become more apparent, and the examples will be better understood by reference to the following description of examples taken in conjunction with the accompanying drawing, wherein.

Corresponding reference characters indicate corresponding parts throughout the several views. The exemplifications set out herein illustrate certain examples, in one form, and such exemplifications are not to be construed as limiting the scope of the examples in any manner.

DETAILED DESCRIPTION

Figure 1:
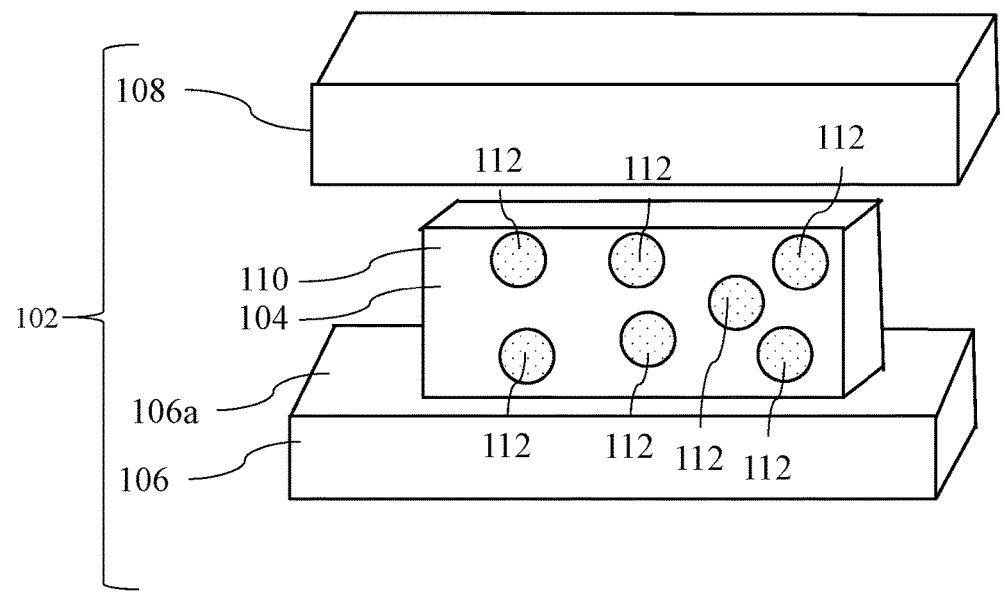
FIG. 1 is a perspective view of a circuit assembly according to the present disclosure after deposition of the thermal interface material.

Certain exemplary aspects of the present invention will now be described to provide an overall understanding of the principles of the composition, function, manufacture, and use of the compositions and methods disclosed herein. An example or examples of these aspects are illustrated in the accompanying drawing. Those of ordinary skill in the art will understand that the compositions, articles, and methods specifically described herein and illustrated in the accompanying drawing are non-limiting exemplary aspects and that the scope of the various examples of the present invention is defined solely by the claims. The features illustrated or described in connection with one exemplary aspect may be combined with the features of other aspects. Such modifications and variations are intended to be included within the scope of the present invention.

Applying a thermal interface material (TIM) to a circuit assembly such that the TIM is between the a integrated heat spreader (IHS) and a heat sink can require balancing the thermal resistance through the TIM and the contact resistance at the material interfaces. For example, a polymeric material may have a low contact resistance at the material interfaces but a high thermal resistance through the material. A solid metal may have a low thermal resistance through the material but a high contact resistance at the material interfaces. Additionally, some solid materials (polymeric or metal) may require a large pressure during installation to achieve a desired contact resistance. Further, it may be desirable to remove the TIM after application such that the TIM can be used for testing of components and/or replacement of components.

Thus, the present inventors provide, in various examples, a thermal interface material, an integrated circuit formed therewith, and a method of application thereof that can enable efficient removal of the TIM after installation while achieving an effective thermal conductivity of the TIM. The TIM comprises 5% to 30% by volume of a polymer component based on a total volume of the thermal interface material and at least 70% by volume of liquid metal droplets based on total volume of the thermal interface material. The liquid metal droplets are dispersed throughout the polymer component. The polymer component comprises a first polymer having a molecular weight in a range of 400 g/mol to 400,000 g/mol, such, as for example, 400 g/mol to 200,000 g/mol, 400 g/mol to 100,000 g/mol, 400 g/mol to 50,000 g/mol, 400 g/mol to 10,000 g/mol, or 400 g/mol to 4,000 g/mol. The molecular weight can be measured using gel permeation chromatography. As used herein, "molecular weight" refers to to the number average molecular weight, $M_n$.

As used in this specification, the terms "polymer" and "polymeric" means prepolymers, oligomers, and both homopolymers and copolymers. As used in this specification, "prepolymer" means a polymer precursor capable of further reactions or polymerization by a reactive group or reactive groups to form a higher molecular mass or cross-linked state.

The first polymer can be at least one of a polymeric binder, a thermosetting polymer, and a thermoplastic polymer. As used herein, the term "thermosetting" refers to polymers that "set" irreversibly upon curing or cross-linking, where the polymer chains of the polymeric components are joined together by covalent bonds, which is often induced, for example, by heat or radiation. In various examples, curing or a cross-linking reaction can be carried out under ambient conditions. Once cured or cross-linked, a thermosetting polymer may not flow upon the application of heat, may otherwise irreversibly increase in viscosity, and/or can be insoluble in conventional solvents. As used herein, the term "thermoplastic" refers to polymers that include polymeric components in which the constituent polymer chains are not joined (e.g., crosslinked) by covalent bonds and thereby can undergo liquid flow upon heating and are soluble in conventional solvents. In certain embodiments, the polymer can be elastomeric (e.g., rubbery, soft, stretchy) or rigid (e.g., glassy). For example, the polymer can be elastomeric.

Thermosetting polymers may include at least one of a cross-linking agent that may comprise, for example, aminoplasts, polyisocyanates (including blocked isocyanates), polyepoxides, beta-hydroxyalkylamides, polyacids, anhydrides, organometallic acid-functional materials, polyamines, polyvinyls, polysilicon hydrides, polyalcohols, polyacid chlorides, polyhalides, and polyamides. A polymer may have functional groups that are reactive with the cross-linking agent.

The thermosetting polymer may comprise at least one of an acrylic polymer, an acrylate polymer, a vinyl polymer, a polyester polymer, a polyurethane polymer, polybutadiene, a polyamide polymer, a polyether polymer, a polysiloxane polymer (e.g., poly(dimethylsiloxone)), a silicon hydride polymer, a fluoropolymer, a polyisoprene polymer (e.g., rubber), and a copolymer thereof. The functional groups on a thermosetting polymer may be selected from any of a variety of reactive functional groups, including, for example, at least one of a carboxylic acid group, an amine group, an epoxide group, a hydroxyl group, a thiol group, a carbamate group, an amide group, a urea group, an isocyanate groups (including a blocked isocyanate group), a vinyl group, a silicon hydride group, an acid chloride group, an acrylate group, a halide group, and a mercaptan group.

In various examples, the first polymer comprises a polyether polymer, such as, for example, a polyalkylene glycol. The polyalkylene glycol can comprise at least one of polyethylene glycol, polypropylene glycol, polybutylene glycol, and a co-polymer thereof. For example, the polyalkylene glycol can comprise polypropylene glycol.

As used in this specification, the terms "cure" and "curing" refer to the chemical cross-linking of components in an emulsion or material applied over a substrate or the increase of viscosity of the components in the emulsion or material applied over the substrate. Accordingly, the terms "cure" and "curing" do not encompass solely physical drying of an emulsion or material through solvent or carrier evaporation. In this regard, the term "cured," as used in this specification in examples comprising a thermosetting polymer, refers to the condition of an emulsion or material in which a component of the emulsion or material has chemically reacted to form new covalent bonds in the emulsion or material (e.g., new covalent bonds formed between a binder resin and a curing agent).

The thermoplastic polymer can comprise at least one of propylene-ethylene co-polymer, styrene-butadiene-styrene, and styrene ethylene butylene styrene. The polymer can comprise a melting point of at least 100 degrees Celsius, such as, for example, at least 120 degrees Celsius, at least 150 degrees Celsius, or at least 200 degrees Celsius.

The polymeric binder can be a polyether binder.

In various examples, the polymer component can comprise a second polymer. The second polymer can be miscible with first polymer. For example, the second polymer can be miscible with polyalkylene glycol. The second polymer can comprise at least one of an epoxy polymer, an acrylate polymer, a vinyl polymer, and a silicon hydride polymer. For example, the second polymer can comprise an epoxy polymer comprising a hydroxyl terminal group, such as, for example, polyalkylene glycol diglycidyl ether.

The polymer component can comprise a composition suitable for efficient removal of the TIM after installation while achieving an effective thermal conductivity during use. For example, the polymer component can comprise 1% by weight to 50% by weight of the first polymer and 50% by weight to 99% by weight of the second polymer, all based on the total weight of the polymer component. In various examples, the polymer component can comprise 5% by weight to 30% by weight of the first polymer and 70% by weight to 95% by weight of the second polymer, all based on the total weight of the polymer component. In certain examples, the polymer component can comprise 1% by weight to 50% by weight of polyalkylene glycol and 50% by weight to 99% by weight of polyalkylene glycol diglycidyl ether or 5% by weight to 30% by weight of polyalkylene glycol and 70% by weight to 95% by weight of polyalkylene glycol diglycidyl ether, all based on the total weight of the polymer component.

The polymer component can be configured to cure at a temperature of at least 50 degrees Celsius, such as, for example, at least 60 degrees Celsius, at least 70 degrees Celsius, at least 80 degrees Celsius, or at least 90 degrees Celsius. For example, the polymer component can be configured to cure at a temperature in a range of 50 degrees Celsius to 150 degrees Celsius, such as, for example, 60 degrees Celsius to 120 degrees Celsius. For example, the second polymer component can be configured to chain extend responsive to heating to a temperature of at least 50 degrees Celsius. The chain extension of the second polymer can increase the molecular weight of the second polymer, thereby increasing the viscosity of the TIM.

The liquid metal droplets for the TIM can comprise at least one of gallium, a gallium alloy, indium, an indium alloy, tin, a tin alloy, mercury, and a mercury alloy. The liquid metal droplets can comprise a melting point of no greater than 30 degrees Celsius, such as, for example, no greater than 25 degrees Celsius, no greater than 20 degrees Celsius, no greater than 15 degrees Celsius, no greater than 10 degrees Celsius, no greater than 5 degrees Celsius, no greater than 0 degrees Celsius, or no greater than −10 degrees Celsius. The liquid metal droplets can comprise a melting point of at least −40 degrees Celsius, such as, for example, at least −20 degrees Celsius, at least −19 degrees Celsius, at least −10 degrees Celsius, at least 0 degrees Celsius, at least 5 degrees Celsius, at least 10 degrees Celsius, at least 15 degrees Celsius, at least 20 degrees Celsius, or at least 25 degrees Celsius. The liquid metal droplets can comprise a melting point in a range of −40 degrees Celsius to 30 degrees Celsius, such as, for example, −20 degrees Celsius to 30 degrees Celsius, −19 degrees Celsius to 30 degrees Celsius, or −19 degrees Celsius to 25 degrees Celsius. The determination of the melting point can be made at a pressure of 1 atmosphere absolute. In certain embodiments, the TIM can comprise Gallium Indium Tin (Galinstan) and a melting point of −19 degrees Celsius.

The TIM can be created by forming an emulsion of the polymer and the liquid metal droplets such that liquid metal droplets are substantially dispersed throughout the polymer. For example, the polymer and bulk liquid metal can be mixed together with at least one of a high shear mixer, a centrifugal mixer, by shaking in a container, a mortar and pestle, and sonication. More details about exemplary ways to form the emulsion and the liquid metal droplets are described in (1) published PCT WO/2019/136252, entitled "Method of Synthesizing a Thermally Conductive and Stretchable Polymer Composite", (2) published U.S. application US 2017/0218167, entitled "Polymer Composite with Liquid Phase Metal Inclusions," (3) U.S. Pat. No. 10,777,483, entitled "Method, apparatus, and assembly for thermally connecting layers", (4) U.S. Provisional Patent No. 63/268,134, entitled "Thermal interface material, an integrated circuit assembly, and a method for thermally connecting layers", (5) published PCT WO 2022/204689 entitled "A method, apparatus, and assembly for thermally connecting layers with thermal interface materials comprising rigid particles", and (6) U.S. provisional application 63/479,879, entitled "A method of Manufacture of a Thermal Interface Material, a Thermal Interface Material Formed Therefrom, and an Integrated Circuit Formed Therefrom", all of which are incorporated herein by reference in their entirety.

The composition and/or mixing techniques can be chosen such that the viscosity is less than 850,000 cP (centipoise), such as, for example, less than 750,000 cP, less than 500,000 cp, less than 250,000 cP, 200,000 cP, less than 150,000 cP, less than 100,000 cP, less than 50,000 cP, less than 15,000 cP, less than 14,000 cP, less than 13,000 cP, less than 12,000 cP, less than 11,000 cP, or less than 10,000 cP. For example, the composition and/or mixing techniques can be chosen such that the viscosity of the TIM is at least 1,000 cP, such as, for example, at least 2,000 cP, at least 5,000 cP, or at least 10,000 cP. The composition and/or mixing techniques can be chosen such that the viscosity of the TIM is in a range of 1,000 cP to 850,000 cP, such as, for example, 2,000 cP to 750,000 cP, or 2,000 cP to 500,000 cP. The viscosity of the TIM emulsion can be measured by a parallel plate (40 mm) rheometer at 25 degrees Celsius, a frequency of 10 radians per second, and a strain of 5%. Selecting the viscosity can require a balance of installation pressure, which may increase with a high viscosity and an ability to resist undesirably fast spreading during application of the TIM and pump out during operation.

The TIM can comprise at least 1% liquid metal droplets by total volume of the TIM, such as, for example, at least 5% liquid metal droplets, at least 10% liquid metal droplets, at least 20% liquid metal droplets, at least 30% liquid metal droplets, at least 40% liquid metal droplets, at least 50% liquid metal droplets, at least 60% liquid metal droplets, at least 70% liquid metal droplets, at least 80% liquid metal droplets, or at least 90% liquid metal droplets, all based on the total volume of the liquid metal droplets. The TIM can comprise no greater than 95% liquid metal droplets by total volume of the TIM, such as, for example, no greater than 93% liquid metal droplets, no greater than 90% liquid metal droplets, no greater than 80% liquid metal droplets, no greater than 70% liquid metal droplets, no greater than 60% liquid metal droplets, no greater than 50% liquid metal droplets, no greater than 40% liquid metal droplets, no greater than 30% liquid metal droplets, no greater than 20% liquid metal droplets, or no greater than 10% liquid metal droplets, all based on the total volume of the TIM. The TIM can comprise a range of 1% to 95% liquid metal droplets by total volume of the TIM, such as, for example, 5% to 93% liquid metal droplets, 50% to 93% liquid metal droplets, 60% to 93% liquid metal droplets, 70% to 95% liquid metal droplets, or 70% to 93% liquid metal droplets, all based on the total volume of the TIM. The amount of liquid metal droplets can be selected while balancing a desired elasticity and a desired effective thermal conductivity of the TIM.

The composition and/or mixing techniques can be selected to achieve a desired $D_{50}$ and/or $D_{90}$ of the liquid metal droplets in the TIM prior to compressing. The $D_{50}$ of the liquid metal droplets can be at least 1 micron prior to compressing, such as, for example, at least 5 microns, at least 10 microns, at least 15 microns, at least 20 microns, at least 30 microns, at least 35 microns, at least 40 microns, at least 50 microns, at least 60 microns, at least 70 microns, at least 80 microns, at least 90 microns, at least 100 microns, at least 120 microns, at least 150 microns, or at least 200 microns, all prior to compressing. The $D_{50}$ of the liquid metal droplets can be no greater than 300 micron, such as, for example, no greater than 250 microns, no greater than 200 microns, no greater than 150 microns, no greater than 120 microns, no greater than 100 microns, no greater than 90 microns, no greater than 80 microns, no greater than 70 microns, no greater than 60 microns, no greater than 50 microns, no greater than 40 microns, no greater than 35 microns, no greater than 30 microns, no greater than 20 microns, no greater than 10 microns, or no greater than 5 microns, all prior to compressing. For example, the $D_{50}$ of the liquid metal droplets can be in a range of 1 microns to 300 microns, such as, for example, 5 microns to 300 microns, 150 microns to 250 microns, 5 microns to 150 microns, 15 to 150 microns, 35 microns to 150 microns, 35 microns to 70 microns, or 5 microns to 100 microns, all measured prior to compressing. In various embodiments, the composition and/or mixing techniques can be selected to achieve an average particle size of the liquid metal droplets that is larger than a $D_{50}$ of rigid particles, if present, in the TIM, such as, for example, at least 1% larger, at least 2% larger, at least 5% larger, at least 10% larger, or at least 20% larger than the $D_{50}$ of the rigid particles.

As used herein, $D_X$ can be measured using microscopy (e.g., optical microscopy). The size can be the diameter of spherical particles or the length along the largest dimension if ellipsoidal or otherwise irregularly shaped particle. As used herein, "$D_X$" of particles refers to the diameter at which X % of the volume of the particles have a smaller diameter.

The $D_{90}$ of the liquid metal droplets can be at least 1 micron, such as, for example, at least 5 microns, at least 10 microns, at least 15 microns, at least 20 microns, at least 30 microns, at least 35 microns, at least 40 microns, at least 50 microns, at least 60 microns, at least 70 microns, at least 80 microns, at least 90 microns, at least 100 microns, at least 120 microns, at least 150 microns, or at least 200 microns, all prior to compressing. The $D_{90}$ of the liquid metal droplets can be no greater than 300 micron, such as, for example, no greater than 250 microns, no greater than 200 microns, no greater than 150 microns, no greater than 120 microns, no greater than 100 microns, no greater than 90 microns, no greater than 80 microns, no greater than 70 microns, or no greater than 50 microns, all prior to compressing. For example, the $D_{90}$ of the liquid metal droplets can be in a range of 1 microns to 300 microns, such as, for example, 5 microns to 300 microns, 150 microns to 250 microns, 10 microns to 200 microns, 15 to 150 microns, 35 microns to 150 microns, 35 microns to 120 microns, or 50 microns to 100 microns, all measured prior to compressing.

The TIM can optionally comprise other components such as, for example, at least one of rigid particles, a catalyst, fumed silica, and coupling agents. The rigid particles can comprise at least one of iron, an iron alloy (e.g., steel), vanadium, a vanadium alloy, niobium, a niobium alloy, titanium, a titanium alloy, copper, a copper alloy (e.g., bronze), aluminum, an aluminum alloy, a rigid polymer, a glass, and a ceramic (e.g., alumina). The rigid particles can be resistant to deformation and/or corrosion by the liquid metal droplets. For example, the rigid particles can comprise a Young's modulus of at least 100 MPa (megapascals), such as, for example, at least 110 MPa, at least 150 MPa, at least 200 MPa, at least 250 MPa, at least 500 MPa, at least 750 MPa, at least 1 GPa (gigapascals), or at least 2 GPa. Young's Modulus can be measured according to ASTM E111-17. The TIM can comprise a range of 0.1% to 30% rigid particles by total volume of the TIM, such as, for example, 0.1% to 10% rigid particles, 0.1% to 5% rigid particles, 1% to 10% rigid particles, or 1% to 5% rigid particles, all based on the total volume of the TIM.

In various examples, the polymer component can comprise 0.1% by to 0.5% by weight of a coupling agent based on a total weight of the polymer component. For example, the coupling agent can comprise at least one of 3-Glycidoxypropyltrimethoxysilane, 3-Glycidoxypropyltriethoxysilane, 3-Aminopropyltrimethoxysilane, and Bis(3-trimethoxysilylpropyl)amine.

In certain examples, the polymer component can comprises 0.1% by weight to 5% by weight of a fumed silica based on a total weight of the polymer component.

The $D_{50}$ of the rigid particles in the TIM can be selected to achieve a desired bondline thickness in the assembly. The average particle size of the rigid particles can be at least 1 micron, such as, for example, at least 5 microns, at least 10 microns, at least 20 microns, at least 30 microns, at least 35 microns, at least 40 microns, at least 50 microns, at least 60 microns, at least 70 microns, at least 80 microns, at least 90 microns, at least 100 microns, at least 120 microns, or at least 125 microns. The $D_{50}$ of the rigid particles can be no greater than 150 microns, such as, for example, no greater than 125 microns, no greater than 120 microns, no greater than 100 microns, no greater than 90 microns, no greater than 80 microns, no greater than 70 microns, no greater than 60 microns, no greater than 50 microns, no greater than 40 microns, no greater than 35 microns, no greater than 30 microns, no greater than 20 microns, no greater than 10 microns, or no greater than 5 microns. For example, the $D_{50}$ of the rigid particles can be in a range of 1 microns to 150 microns, such as, for example, 15 to 150 microns, 5 microns to 125 microns, 35 microns to 125 microns, 35 microns to 70 microns, or 50 microns to 70 microns.

The TIM can be applied to various layers and devices and it is described below with reference to FIGS. 1-2 with reference to a circuit assembly but is not limited to only a circuit assembly and could be applied to other devices. Referring to FIG. 1, the method according to the present disclosure comprises depositing a TIM 104 according to the present disclosure between a first layer 106 of a circuit assembly 102 and a second layer 108 of the circuit assembly 102. As illustrated, the TIM 104 comprises an emulsion of liquid metal droplets 112 and polymer 110.

As used in this specification, particularly in connection with layers, films, or materials, the terms "on," "onto," "over," and variants thereof (e.g., "applied on," "formed on," "deposited on," "provided on," "located on," and the like) mean applied, formed, deposited, provided, or otherwise located over a surface of a substrate but not necessarily in contact with the surface of the substrate. For example, a TIM "deposited on" a substrate or "deposited between" two elements does not preclude the presence of another layer or other layers of the same or different composition located between the applied TIM and the substrate or layers. Likewise, a second layer "deposited on" a first layer does not preclude the presence of another layer or other layers of the same or different composition located between the deposited second layer and the deposited TIM.

Depositing the TIM 104 can comprise at least one of dispensing, extruding (e.g., through a nozzle, such as, a circular nozzle, a fan nozzle, or other nozzle shape), applying with a utensil (e.g., brush, spatula), stencil printing, 3D printing, and screen printing. The TIM 104 can be deposited in a conformable state such that the TIM 104 can adapt to the surfaces of the first layer 106 and the second layer 108 to achieve a desired level of surface contact therebetween. In various examples, the TIM 104 can be applied directly to the first layer 106 and, thereafter, the second layer 108 can be applied directly to the TIM 104. In various other examples, the TIM 104 can be applied directly to the second layer 108 and, thereafter, the first layer 106 can be applied directly to the TIM 104. In certain examples, the TIM 104 can be applied to both the first layer 106 and the second layer 108 and then the first layer 106 and the second layer 108 can be applied together. In various examples, after deposition of the TIM 104 and compression of the circuit assembly 102, the TIM 104 can be in direct contact with the first layer 106 and the second layer 108. In certain examples, the application of the TIM 104 may be limited to the surfaces of the first layer 106 such that the TIM 104 can be efficiently used.

The TIM 104 can be dispensed from a container and applied to a layer in a conformable state. The TIM 104 can be stored in a container prior to use. The TIM 104 can be in a conformable state in the container. The container can comprise at least one of a pillow pack, a syringe, a beaker, a jar, a bottle, and a drum. In various examples, the container can be a ready to use dispensing device, such as, for example, a pillow pack or a syringe. In certain examples, the TIM 104 may not be stored and can be used after creation of the emulsion without storage.

The TIM 104 can be applied to at least 1% of a surface area of an exposed side 106a of the first layer 106 prior to compressing the circuit assembly 102, such as, for example, at least 2%, at least 5%, at least 10%, at least 20%, at least 30%, at least 40%, or at least 50%, all of the surface area of the exposed side 106a of the first layer 106. For example, the TIM 104 can be applied to a range of 1% to 100% of the surface area of an exposed side 106a of the first layer 106 prior to compressing the circuit assembly 102, such as, for example 2% to 100%, 5% to 90%, or 5% to 80%, all of the surface area of the exposed side 106a of the first layer 106.

The first layer 106 can be a heat-generating electronic component (e.g., integrated circuit, such as, a processor, an ASIC, and/or a system-on-a-chip (SOC)) and/or thermally connected to the heat-generating electronic component. The second layer 108 can be an upper layer that can be thermally conductive. The first layer 106 and the second layer 108, individually, can be at least one of a processor, a heat sink (e.g., fins, fan, liquid cooling, cold plate), an integrated heat spreader, and packaging. In various examples, the first layer 106 can comprise a processor and the second layer 108 can comprise at least one of a heat sink, an integrated heat spreader, and packaging. In certain examples, the first layer 106 can comprise an integrated heat spreader and the second layer can comprise at least one of a heat sink, an integrated heat spreader, and packaging.

After deposition of the TIM 104, the method comprises compressing the circuit assembly 102, thereby deforming the liquid metal droplets 112 and forming an integrated circuit 202. For example, referring to the detailed views in FIGS. 1-2, the first layer 106 and the second layer 108 can be urged together. For example, compressing the circuit assembly 102 can comprise applying a first pressure to the first layer 106 and the second layer 108 of at least 1 psi, such as, for example, at least 5 psi, at least 10 psi, at least 15 psi, or at least 20 psi. In various examples, the first pressure can be in a range of 1 psi to 50 psi, such as, for example, 10 to 50 psi or 10 psi to 30 psi.

In various examples, the relative liquid metal surface area coverage between the TIM 104, and the first layer 106 and the second layer 108 can be increased by compression. For example, the relative liquid metal surface area coverage after compression can be in a range of 1% to 100%, such as, for example, 1% to 5%, 5% to 10%, 10% to 30%, 30% to 50%, or increasing until the liquid metal surface area coverage achieves 100%. As used herein, "relative liquid metal area coverage" is the surface area covered by the liquid metal normalized by the total contact surface area between the TIM 104 and the first layer 106 and second layer 108. Relative liquid metal area coverage can be measured using cross-sectioning followed by optical imaging using confocal scanning acoustic microscopy using a Hitachi FineSAT III for CSAM.

After compression, the bondline thickness, ti, of the circuit assembly 102 can be no greater than 300 microns, such as, for example, no greater than 250 microns, no greater than 200 microns, no greater than 200 microns, no greater than 150 microns, no greater than 145 microns, no greater than 140 microns, no greater than 125 microns, no greater than 100 microns, no greater than 80 microns, no greater than 70 microns, no greater than 50 microns, no greater than 40 microns, no greater than 35 microns, or no greater than 30 microns. The bondline thickness, $t_{Bl}$, of the circuit assembly 102 can be at least 1 microns, such as, for example, at least 10 microns, at least 15 microns, at least 30 microns, at least 35 microns, at least 40 microns, at least 50 microns, at least 70 microns, at least 75 microns, at least 80 microns, at least 100 microns, at least 120 microns, at least 140 microns, at least 145 microns, at least 150 microns, at least 200 microns, at least 300 microns, or at least 400 microns. The bondline thickness, $t_{Bl}$, of the circuit assembly 102 can be in a range of 1 micron to 300 microns, such as, for example, 1 micron to 250 microns, 10 microns to 300 microns, 10 microns to 250 microns, 1 micron to 200 microns, 15 microns to 200 microns, 15 microns to 150 microns, 30 microns to 150 microns, 50 microns to 120 microns, 75 microns to 125 microns, or 15 microns to 100 microns.

The $D_{90}$ of the liquid metal droplets 112 in the TIM 104 prior to applying can be greater than the bondline thickness, $t_{Bl}$. For example, the $D_{90}$ of the liquid metal droplets 312 prior to applying and/or a compressing process can be greater than the bondline thickness, $t_{Bl}$, such as, for example, 1% greater than the bondline thickness, $t_{Bl}$, 2% greater than the bondline thickness, $t_{Bl}$, 5% greater than the bondline thickness, $t_{Bl}$, 10% greater than the bondline thickness, $t_{Bl}$, 15% greater than the bondline thickness, $t_{Bl}$, 20% greater than the bondline thickness, $t_{Bl}$, 30% greater than the bondline thickness, $t_{Bl}$, 40% greater than the bondline thickness, $t_{Bl}$, 50% greater than the bondline thickness, $t_{Bl}$, or 75% greater than the bondline thickness, $t_{Bl}$. The $D_{90}$ of the liquid metal droplets 112 prior to applying and/or a compressing process can be no more than 100% greater than the bondline thickness, $t_{Bl}$, such as, for example, no more than 75% greater than the bondline thickness, $t_{Bl}$, no more than 50% greater than the bondline thickness, $t_{Bl}$, no more than 40% greater than the bondline thickness, $t_{Bl}$, no more than 30% greater than the bondline thickness, $t_{Bl}$, no more than 20% greater than the bondline thickness, $t_{Bl}$, no more than 15% greater than the bondline thickness, $t_{Bl}$, no more than 10% greater than the bondline thickness, $t_{Bl}$, no more than 5% greater than the bondline thickness, $t_{Bl}$, or no more than 2% greater than the bondline thickness, $t_{Bl}$. The $D_{90}$ of the liquid metal droplets 112 prior to applying and/or a compressing process can be in a range of 1% to 100% greater than the bondline thickness, $t_{Bl}$, such as, for example, 1% to 50% greater than the bondline thickness, $t_{Bl}$, 1% to 30% greater than the bondline thickness, $t_{Bl}$, 2% to 30% greater than the bondline thickness, $t_{Bl}$, or 5% to 20% greater than the bondline thickness, $t_{Bl}$.

The TIM can cover at least 90% of a surface area of an exposed side 106a of the first layer 106 after compressing the circuit assembly, such as, for example, at least 95% of the surface area of the exposed side 106a.

Compressing the circuit assembly 102 can apply a force to the TIM 104 and can deform the liquid metal droplets 112 dispersed within the polymer 110 of the TIM 104. Because the polymer 110 is still conformable and moveable, the compressing force can deform the liquid metal droplets 112. The liquid metal droplets 112 can be in the liquid phase during deformation such that a lower pressure is required for the compression and a desired deformation is achieved. For example, the liquid metal droplets 112 can be generally spherical as shown in FIG. 1 and thereafter can be generally ellipsoidal as shown in FIG. 2. In various examples, the liquid metal droplets 112 prior to compressing can have a first average aspect ratio and after compressing the liquid metal droplets 112 can have a second average aspect ratio. The second average aspect ratio can be different that the first average aspect ratio. For example, the second average aspect ratio can be greater than the first average aspect ratio. The average aspect ratio can be a mean ratios of the width of the liquid metal droplets 112 to the height of the liquid metal droplets 112. In various examples, the first aspect ratio can be 1 and the second aspect ratio can be greater than 1. In certain embodiments, the first aspect ratio can be in a range of 1 to 1.5. In certain embodiments, the second aspect ratio can be at least 0.5 greater than the first aspect ratio, such as, for example, at least 1 greater than the first aspect ratio, at least 2 greater than the first aspect ratio, or at least 5 greater than the first aspect ratio. In certain embodiments, the second aspect ratio can be at least 2 after compressing the circuit assembly 102, such as, for example, at least 3, or at least 4 after compressing the circuit assembly 102.

The width (e.g., longest dimension) of the liquid metal droplets 112 can be substantially aligned with the longitudinal plane of the TIM 104 in the circuit assembly 102 and the height of the liquid metal droplets 112 can be substantially aligned with the thickness of the TIM 104 (e.g., bondline thickness, $t_{BL}$). The width of the liquid metal droplets 112 can increase upon compression of the circuit assembly 102. For example, in certain examples, the diameter of liquid metal droplets prior to compressing can be 200 μm (with a first aspect ratio of 1) and after compression to a bondline thickness of 100 μm, the liquid metal drop can be deformed to an ellipsoidal shape with a 400 μm width (e.g., second aspect ratio of 4).

Figure 2:
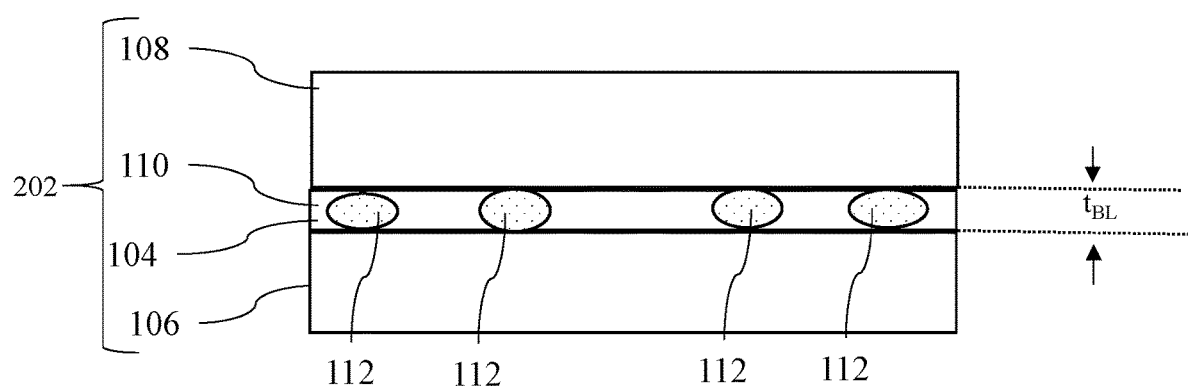
FIG. 2 is a side view of an integrated circuit formed by compressing the circuit assembly of FIG. 1.

In certain examples, the liquid metal droplets 112 can be aligned substantially in a monolayer as shown in FIG. 2 after compressing. The monolayer can be achieved by selecting the $D_{50}$ and/or $D_{90}$ of the liquid metal droplets 112 and the bondline thickness, $t_{BL}$. Configuring the liquid metal droplets 112 in a monolayer can reduce the thermal resistance of the TIM 104.

The $D_{50}$ and/or $D_{90}$ of the liquid metal droplets 112, deformation of the liquid metal droplets 112, and the method of deposition of the liquid metal droplets 112 can improve the thermal resistance value of the TIM 104. For example, the TIM 104 can comprise a thermal resistance value of at least 5 (° K.*mm$^2$)/W, such as, for example, at least 1 (° K.*mm$^2$)/W, at least 2 (° K.*mm$^2$)/W, at least 3 (° K.*mm$^2$)/W, at least 5 (° K.*mm$^2$)/W, or at least 10 (° K.*mm$^2$)/W. The TIM 104 can comprise a thermal resistance value of no greater than 30 (° K.*mm$^2$)/W, such as, for example, no greater than 20 (° K.*mm$^2$)/W, no greater than 15 (° K.*mm$^2$)/W, no greater than 10 (° K.*mm$^2$)/W, no greater than 9 (° K.*mm$^2$)/W, no greater than 8 (° K.*mm$^2$)/W, no greater than 7 (° K.*mm$^2$)/W, or no greater than 5 (° K.*mm$^2$)/W. The TIM 104 can comprise a thermal resistance value in a range of 0.5 (° K.*mm$^2$)/W to 30 (° K.*mm$^2$)/W, such as, for example, 0.5 (° K.*mm$^2$)/W to 20 (° K.*mm$^2$)/W, 0.5 (° K.*mm$^2$)/W to 15 (° K.*mm$^2$)/W, 1 (° K.*mm$^2$)/W to 10 (° K.*mm$^2$)/W, 2 (° K.*mm$^2$)/W to 10 (° K.*mm$^2$)/W, or 2 (° K.*mm$^2$)/W to 8 (° K.*mm$^2$)/W. The thermal resistance value can be measured using a TIMA 5 instrument from NanoTest (Germany).

The $D_{50}$ and/or $D_{90}$ of the liquid metal droplets 112, deformation of the liquid metal droplets 112, and the method of deposition of the liquid metal droplets 112 can improve the thermal conductivity value of the TIM 104. For example, the TIM 104 can comprise an effective thermal conductivity value of at least 5 W/m*K, such as, for example, at least 10 W/m*K, at least 12 W/m*K, at least 15 W/m*K, at least 17 W/m*K, or at least 20 W/m*K. The TIM can comprise an effective thermal conductivity value in a range of 5 W/m*K to 50 W/m*K, such as, for example, 10 W/m*K to 40 W/m*K or 10 W/m*K to 30 W/m*K. As used herein, the effective thermal conductivity is a thickness of the TIM divided by a thermal resistance of the TIM.

The TIM 104 can be cured or may not be cured depending on the application. For example, the TIM 104 may be cured to thicken the TIM 104, which can increase the viscosity of the polymer 110. Applying the TIM 104 at a lower viscosity can enable a more efficient installation and ability to wet the surfaces of the first layer 106 and the second layer 108. Increasing the viscosity after application can enable the TIM 104 to resist pump out and enhance removal of the TIM 104.

Curing the TIM 104 can comprise at least one of heating the TIM 104, adding a catalyst to the TIM 104, exposing the TIM 104 to air, applying electromagnetic radiation (e.g., photo-polymerization), and applying pressure to the TIM 104. For example, the polymer component in the TIM 104 can be cured. Curing the TIM 104 can increase the viscosity of the TIM emulsion. For example, the TIM 104 can comprise a viscosity after curing that is at least double a viscosity of the TIM prior to curing, such as, for example, at least triple, at least quadrupole or ten times a viscosity of the TIM prior to curing. For example, the TIM 104 can comprise a viscosity after curing of greater than 15,000 cP, such as, for example, greater than 20,000 cP, greater than 30,000 cP, greater than 50,000 cP, greater than 100,000 cP, greater than 150,000 cP, greater than 200,000 cP, greater than 250,000 cP, greater than 500,000 cP, greater than 750,000 cP, greater than 850,000 cP, greater than 1,000,000 cP, greater than 1,500,000 cP, greater than 2,500,000 cP, greater than 4,000,000 cP, or greater than 5,000,000 cP.

The circuit assembly can be used with the TIM 104 and the TIM 104 can facilitate heat transfer between the first layer 106 and the second layer 108. The TIM 104 can be removed from at least one of the first layer 106 and/or the second layer 108. For example, the TIM 104 can be scrapped off of the first layer 106 and/or the second layer 108. In various examples, the TIM 104 can be removed with a solvent, such as, for example, isopropyl alcohol. In certain examples, the TIM 104 can be removed by scrapping and use of a solvent. The removal of the TIM 104 can be more efficient due to the increase in viscosity after curing.

In various other examples, the TIM according to the present disclosure can be used in a system on a package. For example, a single horizontal TIM layer can be in contact with multiple dies on one side (e.g., the integrated circuit can comprise multiple dies or multiple integrated circuits can be in contact with the same side of the TIM) and an upper layer or layers on a different side.

Those skilled in the art will recognize that the herein described compositions, articles, methods, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

With respect to the appended claims, those skilled in the art will appreciate that recited operations therein may generally be performed in any order. Also, although various operational flows are presented in a sequence(s), it should be understood that the various operations may be performed in other orders than those that are illustrated or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

Although various examples have been described herein, many modifications, variations, substitutions, changes, and equivalents to those examples may be implemented and will occur to those skilled in the art. Also, where materials are disclosed for certain components, other materials may be used. It is therefore to be understood that the foregoing description and the appended claims are intended to cover all such modifications and variations as falling within the scope of the disclosed examples. The following claims are intended to cover all such modification and variations.

Various aspects of the invention according to the present disclosure include, but are not limited to, the aspects listed in the following numbered clauses.

Clause 1. A thermal interface material comprising: 5% to 30% by volume of a polymer component based on a total volume of the thermal interface material, the polymer component comprising polyalkylene glycol having a molecular weight in a range of 400 g/mol to 4,000 g/mol; and at least 70% by volume of liquid metal droplets based on total volume of the thermal interface material, wherein the liquid metal droplets are dispersed throughout the polymer component.

Clause 2. The thermal interface material of clause 1, wherein the polyalkylene glycol comprises at least one of polyethylene glycol, polypropylene glycol, polybutylene glycol, and a copolymer thereof.

Clause 3. The thermal interface material of clause 1, wherein the polyalkylene glycol comprises polypropylene glycol.

Clause 4. The thermal interface material of any of clauses 1-3, wherein the polymer component further comprises a second polymer.

Clause 5. The thermal interface material of clause 4, wherein the second polymer is miscible with the polyalkylene glycol.

Clause 6. The thermal interface material of clause 4, wherein the second polymer comprises at least one of an epoxy polymer, an acrylate polymer, a vinyl polymer, and a silicon hydride polymer.

Clause 7. The thermal interface material of clause 4, wherein the second polymer comprises an epoxy polymer comprising a hydroxyl terminal group.

Clause 8. The thermal interface material of clause 4, wherein the second polymer comprises polyalkylene glycol diglycidyl ether.

Clause 9. The thermal interface material of clause 8, wherein the polymer component comprises: 1% to 50% by weight of the polyalkylene glycol based on a total weight of the polymer component; and 50% to 99% by weight of the polyalkylene glycol diglycidyl ether based on the total weight of the polymer component.

Clause 10. The thermal interface material of any of clauses 4-9, wherein the polymer component is configured to cure at a temperature of at least 50° C.

Clause 11. The thermal interface material of any of clauses 4-10, wherein the thermal interface material comprises a first viscosity in a range of 1,000 cP to 850,000 cP measured at 25° C. prior to curing.

Clause 12. The thermal interface material of clause 11, wherein the thermal interface material has a second viscosity at least double the first viscosity after curing.

Clause 13. The thermal interface material of any of clauses 4-12, wherein the polymer component is configured to extend a polymer chain of the second polymer responsive to heating to a temperature of at least 50° C.

Clause 14. The thermal interface material of any of clauses 1-13, further comprising at least one of a catalyst and rigid particles.

Clause 15. The thermal interface material of any of clauses 1-14, wherein the polymer component further comprises 0.1% to 0.5% by weight of a coupling agent based on a total weight of the polymer component.

Clause 16. The thermal interface material of any of clauses 1-15, wherein the polymer component further comprises 0.1 to 5% by weight of a fumed silica based on a total weight of the polymer component.

Clause 17. The thermal interface material of any of clauses 1-16, wherein the polymer component further comprises a catalyst.

Clause 18. The thermal interface material of any of clauses 1-17, wherein the liquid metal droplets comprise gallium, a gallium alloy, indium, an indium alloy, tin, a tin alloy, mercury, a mercury alloy, or a combination thereof.

Clause 19. The thermal interface material of any of clauses 1-18, wherein the liquid metal droplets comprise a melting point no greater than 30 degrees Celsius.

Clause 20. The thermal interface material of any of clauses 1-19, wherein the polymer component further comprises a cross-linking agent selected from the group consisting of aminoplasts, polyisocyanates, polyepoxides, beta-hydroxyalkylamides, polyacids, anhydrides, organometallic acid-functional materials, polyamines, polyvinyls, polysilicon hydrides, polyalcohols, polyacid chlorides, polyhalides, and polyamides.

Clause 21. A circuit assembly comprising: a first layer; a second layer; and the thermal interface material of any of clauses 1-20 disposed in contact with and between the first layer and the second layer.

Clause 22. The circuit assembly of clause 21, wherein the liquid metal droplets are generally ellipsoidal.

Clause 23. The circuit assembly of any of clauses 21-22, wherein a bondline thickness formed between the first layer and the second layer is no greater than 300 microns.

Clause 24. The circuit assembly of any of clauses 21-23, wherein the first layer comprises a processor and the second layer comprises at least one of a heat sink, an integrated heat spreader, a cold plate, a fan, a liquid cooling system, and packaging.

Clause 25. The circuit assembly of any of clauses 21-24, wherein the first layer comprises an integrated heat spreader and the second layer comprises at least one of a heat sink, a cold plate, a fan, a liquid cooling system, an integrated heat spreader, and packaging.

Clause 26. A method comprising: depositing the thermal interface material of any of clauses 1-20 between a first layer of an integrated circuit assembly and a second layer of the integrated circuit assembly; and compressing the integrated circuit assembly thereby deforming the liquid metal droplets, wherein a $D_{90}$ of the liquid metal droplets in the thermal interface material prior to applying is greater than a bondline thickness formed between the first layer and the second layer.

Clause 27. The method of clause 26, further comprising, after compressing the integrated circuit assembly, curing the thermal interface material thereby forming a cured assembly.

Clause 28. The method of clause 27, wherein the curing comprises heating the thermal interface material to at least 50° C.

Clause 29. The method of clause 27, wherein the curing comprising heating the thermal interface material to at least 50° C. with the first layer.

Clause 30. The method of any of clauses 26-29, further comprising removing the thermal interface material from at least one of the first layer and the second layer.

Clause 31. An integrated circuit assembly produced by the method of any of clauses 26-30.

Clause 32. A thermal interface material comprising: 5% to 30% by volume of a polymer component based on a total volume of the thermal interface material, the polymer component having a first polymer having a molecular weight in a range of 400 g/mol to 400,000 g/mol and a second polymer component, wherein the second polymer is configured to chain extend responsive to heating to a temperature of at least 50° C.; at least 70% by volume of liquid metal droplets based on total volume of the thermal interface material, wherein the liquid metal droplets are dispersed throughout the polymer component.

Clause 33. The thermal interface material of clause 32, wherein the second polymer is miscible with the first polymer.

Clause 34. The thermal interface material of any of clauses 32-33, wherein the second polymer comprises an epoxy polymer, an acrylate polymer, a vinyl polymer, and a silicon hydride polymer.

Clause 35. The thermal interface material of any of clauses 32-34, wherein the first polymer comprises at least one of a polymeric binder, a thermosetting polymer, and a thermoplastic polymer.

Clause 36. The thermal interface material of any of clauses 32-35, wherein the first polymer comprises at least one of an acrylic polymer, an acrylate polymer, a vinyl polymer, a polyester polymer, a polyurethane polymer, polybutadiene, a polyamide polymer, a polyether polymer, a polysiloxane polymer, a silicon hydride polymer, a fluoropolymer, a polyisoprene polymer, and a copolymer thereof.

Clause 37. The thermal interface material of any of clauses 32-36, wherein the polymer component comprises: 1% to 50% by weight of the first polymer based on a total weight of the polymer component; and 50% to 99% by weight of the second polymer based on the total weight of the polymer component.

Clause 38. The thermal interface material of any of clauses 32-37, wherein the polymer component is configured to cure at a temperature of at least 50° C.

Clause 39. The thermal interface material of any of clauses 32-38, wherein the thermal interface material comprises a first viscosity in a range of 1,000 cP to 850,000 cP measured at 25° C. prior to curing.

Clause 40. The thermal interface material of clause 39, wherein the thermal interface material has a second viscosity at least double the first viscosity after curing.

Clause 41. The thermal interface material of any of clauses 32-40, wherein the polymer component is configured to extend a polymer chain of the second polymer responsive to heating to a temperature of at least 50° C.

Clause 42. The thermal interface material of any of clauses 32-41, wherein the polymer component further comprises a cross-linking agent selected from the group consisting of aminoplasts, polyisocyanates, polyepoxides, beta-hydroxyalkylamides, polyacids, anhydrides, organometallic acid-functional materials, polyamines, polyvinyls, polysilicon hydrides, polyalcohols, polyacid chlorides, polyhalides, and polyamides.

Clause 43. A circuit assembly comprising: a first layer; a second layer; and the thermal interface material of any of clauses 32-42 disposed in contact with and between the first layer and the second layer.

Clause 44. A method comprising: depositing the thermal interface material of any of clauses 32-42 between a first layer of an integrated circuit assembly and a second layer of the integrated circuit assembly; and compressing the integrated circuit assembly thereby deforming the liquid metal droplets, wherein a $D_{90}$ of the liquid metal droplets in the thermal interface material prior to applying is greater than a bondline thickness formed between the first layer and the second layer.

As used herein, "at least one of" a list of elements means one of the elements or any combination of two or more of the listed elements. As an example "at least of A, B, and C" means A only; B only; C only; A and B; A and C; B and C; or A, B, and C.

Various features and characteristics are described in this specification to provide an understanding of the composition, structure, production, function, and/or operation of the invention, which includes the disclosed compositions, coatings, and methods. It is understood that the various features and characteristics of the invention described in this specification can be combined in any suitable manner, regardless of whether such features and characteristics are expressly described in combination in this specification. The Inventors and the Applicant expressly intend such combinations of features and characteristics to be included within the scope of the invention described in this specification. As such, the claims can be amended to recite, in any combination, any features and characteristics expressly or inherently described in, or otherwise expressly or inherently supported by, this specification. Furthermore, the Applicant reserves the right to amend the claims to affirmatively disclaim features and characteristics that may be present in the prior art, even if those features and characteristics are not expressly described in this specification. Therefore, any such amendments will not add new matter to the specification or claims and will comply with the written description, sufficiency of description, and added matter requirements.

Any numerical range recited in this specification describes all sub-ranges of the same numerical precision (i.e., having the same number of specified digits) subsumed within the recited range. For example, a recited range of "1.0 to 10.0" describes all sub-ranges between (and including) the recited minimum value of 1.0 and the recited maximum value of 10.0, such as, for example, "2.4 to 7.6," even if the range of "2.4 to 7.6" is not expressly recited in the text of the specification. Accordingly, the Applicant reserves the right to amend this specification, including the claims, to expressly recite any sub-range of the same numerical precision subsumed within the ranges expressly recited in this specification. All such ranges are inherently described in this specification such that amending to expressly recite any such sub-ranges will comply with the written description, sufficiency of description, and added matter requirements.

Also, unless expressly specified or otherwise required by context, all numerical parameters described in this specification (such as those expressing values, ranges, amounts, percentages, and the like) may be read as if prefaced by the word "about," even if the word "about" does not expressly appear before a number. Additionally, numerical parameters described in this specification should be construed in light of the number of reported significant digits, numerical precision, and by applying ordinary rounding techniques. It is also understood that numerical parameters described in this specification will necessarily possess the inherent variability characteristic of the underlying measurement techniques used to determine the numerical value of the parameters.

Notwithstanding that numerical ranges and parameters setting forth the broad scope of the invention are approximations, numerical values set forth in the specific examples are reported precisely as possible. Any numerical value, however, inherently contains certain errors necessarily resulting from the standard variation found in its respective testing measurements.

Reference throughout the specification to "various examples," "some examples," "one example," "an example," or the like means that a particular feature, structure, or characteristic described in connection with the example is included in an example. Thus, appearances of the phrases "in various examples," "in some examples," "in one example," "in an example," or the like, in places throughout the specification are not necessarily all referring to the same example. Furthermore, the particular features, structures, or characteristics may be combined in any suitable manner in an example or examples. Thus, the particular features, structures, or characteristics illustrated or described in connection with one example may be combined, in whole or in part, with the features, structures, or characteristics of another example or other examples without limitation. Such modifications and variations are intended to be included within the scope of the present examples.

Any patent, publication, or other document identified in this specification is incorporated by reference into this specification in its entirety unless otherwise indicated but only to the extent that the incorporated material does not conflict with existing descriptions, definitions, statements, illustrations, or other disclosure material expressly set forth in this specification. As such, and to the extent necessary, the express disclosure as set forth in this specification supersedes any conflicting material incorporated by reference. Any material, or portion thereof, that is incorporated by reference into this specification, but which conflicts with existing definitions, statements, or other disclosure material set forth herein, is only incorporated to the extent that no conflict arises between that incorporated material and the existing disclosure material. Applicant reserves the right to amend this specification to expressly recite any subject matter, or portion thereof, incorporated by reference. The amendment of this specification to add such incorporated subject matter will comply with the written description, sufficiency of description, and added matter requirements.

Whereas particular examples of this invention have been described above for purposes of illustration, it will be evident to those skilled in the art that numerous variations of the details of the present invention may be made without departing from the invention as defined in the appended claims.

While the present disclosure provides descriptions of various specific aspects for the purpose of illustrating various aspects of the present disclosure and/or its potential applications, it is understood that variations and modifications will occur to those skilled in the art. Accordingly, the invention or inventions described herein should be understood to be at least as broad as they are claimed and not as more narrowly defined by particular illustrative aspects provided herein.

It is understood that the inventions described in this specification are not limited to the examples summarized in the Summary or Detailed Description. Various other aspects are described and exemplified herein.

What is claimed is:

1. A thermal interface material comprising:
   5% to 30% by volume of a polymer component based on a total volume of the thermal interface material, the polymer component comprising polyalkylene glycol having a molecular weight in a range of 400 g/mol to 4,000 g/mol, wherein the polyalkylene glycol comprises polypropylene glycol; and
   at least 70% by volume of liquid metal droplets based on total volume of the thermal interface material, wherein the liquid metal droplets are dispersed throughout the polymer component.

2. A thermal interface material comprising:
   5% to 30% by volume of a polymer component based on a total volume of the thermal interface material, the polymer component comprising polyalkylene glycol having a molecular weight in a range of 400 g/mol to 4,000 g/mol, wherein the polymer component further comprises a second polymer, and the second polymer comprises an epoxy polymer comprising a hydroxyl terminal group; and
   at least 70% by volume of liquid metal droplets based on total volume of the thermal interface material, wherein the liquid metal droplets are dispersed throughout the polymer component.

3. The thermal interface material of claim 2, wherein the second polymer is miscible with the polyalkylene glycol.

4. The thermal interface material of claim 2, wherein the second polymer comprises polyalkylene glycol diglycidyl ether.

5. The thermal interface material of claim 4, wherein the polymer component comprises:
   1% to 50% by weight of the polyalkylene glycol based on a total weight of the polymer component; and
   50% to 99% by weight of the polyalkylene glycol diglycidyl ether based on the total weight of the polymer component.

6. The thermal interface material of claim 2, wherein the polymer component is configured to cure at a temperature of at least 50° C.

7. The thermal interface material of claim 2, wherein the thermal interface material comprises a first viscosity in a range of 1,000 cP to 850,000 cP measured at 25° C. prior to curing.

8. The thermal interface material of claim 7, wherein the thermal interface material has a second viscosity at least double the first viscosity after curing.

9. The thermal interface material of claim 2, wherein the polymer component is configured to extend a polymer chain of the second polymer responsive to heating to a temperature of at least 50° C.

10. The thermal interface material of claim 1, further comprising at least one of a catalyst and rigid particles.

11. The thermal interface material of claim 1, wherein the polymer component further comprises 0.1% to 0.5% by weight of a coupling agent based on a total weight of the polymer component.

12. The thermal interface material of claim 1, wherein the polymer component further comprises 0.1 to 5% by weight of a fumed silica based on a total weight of the polymer component.

13. The thermal interface material of claim 1, wherein the polymer component further comprises a catalyst.

14. The thermal interface material of claim 1, wherein the liquid metal droplets comprise gallium, a gallium alloy, indium, an indium alloy, tin, a tin alloy, mercury, a mercury alloy, or a combination thereof.

15. The thermal interface material of claim 1, wherein the liquid metal droplets comprise a melting point no greater than 30 degrees Celsius.

16. The thermal interface material of claim 1, wherein the polymer component further comprises a cross-linking agent selected from the group consisting of aminoplasts, polyisocyanates, polyepoxides, beta-hydroxyalkylamides, polyacids, anhydrides, organometallic acid-functional materials, polyamines, polyvinyls, polysilicon hydrides, polyalcohols, polyacid chlorides, polyhalides, and polyamides.

17. A circuit assembly comprising:
a first layer;
a second layer; and
the thermal interface material of claim 1 disposed in contact with and between the first layer and the second layer.

18. A method comprising:
depositing the thermal interface material of claim 1 between a first layer of an integrated circuit assembly and a second layer of the integrated circuit assembly; and
compressing the integrated circuit assembly thereby deforming the liquid metal droplets, wherein a $D_{90}$ of the liquid metal droplets in the thermal interface material prior to applying is greater than a bondline thickness formed between the first layer and the second layer.

19. A thermal interface material comprising:
5% to 30% by volume of a polymer component based on a total volume of the thermal interface material, the polymer component having a first polymer having a molecular weight in a range of 400 g/mol to 400,000 g/mol and a second polymer component, wherein the second polymer is configured to chain extend responsive to heating to a temperature of at least 50° C.; and
at least 70% by volume of liquid metal droplets based on total volume of the thermal interface material, wherein the liquid metal droplets are dispersed throughout the polymer component.

20. The thermal interface material of claim 19, wherein the second polymer is miscible with the first polymer.

21. The thermal interface material of claim 19, wherein the second polymer comprises an epoxy polymer, an acrylate polymer, a vinyl polymer, and a silicon hydride polymer and wherein the first polymer comprises at least one of a polymeric binder, a thermosetting polymer, and a thermoplastic polymer.

22. The thermal interface material of claim 19, wherein the first polymer comprises at least one of an acrylic polymer, an acrylate polymer, a vinyl polymer, a polyester polymer, a polyurethane polymer, polybutadiene, a polyamide polymer, a polyether polymer, a polysiloxane polymer, a silicon hydride polymer, a fluoropolymer, a polyisoprene polymer, and a copolymer thereof.

23. The thermal interface material of claim 19, wherein the polymer component comprises:
1% to 50% by weight of the first polymer based on a total weight of the polymer component; and
50% to 99% by weight of the second polymer based on the total weight of the polymer component.

24. The thermal interface material of claim 19, wherein the thermal interface material comprises a first viscosity in a range of 1,000 cP to 850,000 cP measured at 25° C. prior to curing.

25. The thermal interface material of claim 24, wherein the thermal interface material has a second viscosity at least double the first viscosity after curing.

26. A thermal interface material comprising:
5% to 30% by volume of a polymer component based on a total volume of the thermal interface material, the polymer component comprising polyalkylene glycol having a molecular weight in a range of 400 g/mol to 4,000 g/mol; and
at least 70% by volume of liquid metal droplets based on total volume of the thermal interface material, wherein the liquid metal droplets are dispersed throughout the polymer component,
wherein the polymer component further comprises:
0.1% to 0.5% by weight of a coupling agent based on a total weight of the polymer component;
0.1 to 5% by weight of a fumed silica based on a total weight of the polymer component; or
a combination thereof.

27. The thermal interface material of claim 26, wherein the polymer component comprises 0.1% to 0.5% by weight of a coupling agent based on a total weight of the polymer component.

28. The thermal interface material of claim 26, wherein the polymer component comprising 0.1 to 5% by weight of a fumed silica based on a total weight of the polymer component.

29. The thermal interface material of claim 1, wherein the polymer component further comprises a second polymer.

30. The thermal interface material of claim 29, wherein the polymer component is configured to cure at a temperature of at least 50° C.

* * * * *